(12) United States Patent
Firdosy et al.

(10) Patent No.: US 11,731,196 B2
(45) Date of Patent: Aug. 22, 2023

(54) METHOD FOR FORMING MULTI-MATERIAL ELECTROMAGNETIC SHIELD

(71) Applicant: California Institute of Technology, Pasadena, CA (US)

(72) Inventors: Samad A. Firdosy, Pasadena, CA (US); Robert P. Dillon, Long Beach, CA (US); Nicholas E. Ury, Pasadena, CA (US); Katherine Dang, Pasadena, CA (US); Joshua Berman, Pasadena, CA (US); Pablo Narvaez, Pasadena, CA (US); Vilupanur A. Ravi, Claremont, CA (US); John Paul Castelo Borgonia, Monrovia, CA (US); Joelle T. Cooperrider, Pasadena, CA (US); Bryan W. McEnerney, Pasadena, CA (US); Andrew A. Shapiro-Scharlotta, Glendale, CA (US)

(73) Assignee: California Institute of Technology, Pasadena, CA (US)

( * ) Notice: Subject to any disclaimer, the term of this patent is extended or adjusted under 35 U.S.C. 154(b) by 27 days.

(21) Appl. No.: 17/394,881

(22) Filed: Aug. 5, 2021

(65) Prior Publication Data
US 2022/0203442 A1    Jun. 30, 2022

Related U.S. Application Data

(60) Provisional application No. 63/061,643, filed on Aug. 5, 2020.

(51) Int. Cl.
*B22F 7/02* (2006.01)
*B22F 10/28* (2021.01)
(Continued)

(52) U.S. Cl.
CPC .......... *B22F 7/02* (2013.01); *B22F 3/15* (2013.01); *B22F 10/28* (2021.01); *B22F 10/64* (2021.01);
(Continued)

(58) Field of Classification Search
CPC .... B22F 1/17; B22F 7/02; B22F 10/25; B22F 10/00; B22F 10/20; B22F 10/28; B22F 10/66; B33Y 10/00; B33Y 80/00
(Continued)

(56) References Cited

U.S. PATENT DOCUMENTS

| 9,101,979 B2 | 8/2015 | Hofmann et al. | |
| 2007/0105445 A1* | 5/2007 | Manto | H05K 9/0084 439/620.09 |
| 2021/0225584 A1* | 7/2021 | Catalano | H01F 6/06 |

OTHER PUBLICATIONS

Bauer et al., "Microstructure and electro-magnetic properties of a nickel-based anti-magnetic shielding alloy", Solid Freeform Fabrication 2016: Proceedings of the 27th Annual International Solid Freeform Fabrication Symposium—An Additive Manufacturing Conference, 13 pgs., https://doi.org/10.3929/ethz-a-010805380.
(Continued)

*Primary Examiner* — Thiem D Phan

(57) ABSTRACT

Systems and methods of additively manufacturing multi-material electromagnetic shields are described. Additive manufacturing processes use co-deposition to incorporate multiple materials and/or microstructures selected to achieve specified shield magnetic properties. Geometrically complex shields can be manufactured with alternating shielding materials optimized for the end use application. The microstructures of the printed shields can be tuned by optimizing the print parameters.

30 Claims, 11 Drawing Sheets

(51) Int. Cl.
| | |
|---|---|
| B22F 3/15 | (2006.01) |
| B22F 10/64 | (2021.01) |
| B33Y 10/00 | (2015.01) |
| B33Y 80/00 | (2015.01) |
| H05K 9/00 | (2006.01) |
| B33Y 40/20 | (2020.01) |

(52) U.S. Cl.
CPC .............. B33Y 10/00 (2014.12); B33Y 40/20 (2020.01); B33Y 80/00 (2014.12); H05K 9/0081 (2013.01); *B22F 2301/35* (2013.01); *B22F 2304/10* (2013.01); *Y10T 29/49002* (2015.01)

(58) Field of Classification Search
USPC .................. 29/592.1, 428, 527.1, 593, 602.1
See application file for complete search history.

(56) References Cited

OTHER PUBLICATIONS

Chaudhary et al., "Accelerated study of magnetic Fe—Co—Ni alloys through compositionally graded spark plasma sintered samples", Journal of Alloys and Compounds, 2021, vol. 869, 159318, available online Feb. 25, 2021, 7 pgs., https://doi.org/10.1016/j.jalicom.2021.159318.
Chaudhary et al., "Additive manufacturing of functionally graded Co—Fe and Ni—Fe magnetic materials", Journal of Alloys and Compounds, 2020, vol. 823, 153817, 8 pgs., available online Jan. 11, 2020, https://doi.org/10.1016/j.jallcom.2020.153817.
Chaudhary et al., "Additive manufacturing of magnetic materials", Progress in Materials Science, 2020, vol. 114, 100688, 38 pgs., available online May 25, 2020, https://doi.org/10.1016/j.pmatsci.2020.100688.
El-Moez et al., "Magnetic Shielding Promotion via the Control of Magnetic Anisotropy and Thermal Post Processing in Laser Powder Bed Fusion Processed NiFeMo-based Soft Magnet", Additive Manufacturing, 2020, 33 pgs., doi: https://doi.org/10.1016/j.addma.2020.101079.
Lamichhane et al., "Additive manufacturing of soft magnets for electrical machines—A review", Materials Today Physics, 130 pgs. https://doilorg/10.1016/j.mtphys.2020.100255.
Li et al., "Additively manufactured Ni—15Fe—5Mo Permalloy via selective laser melting and annealing for magnetic-shielding structures: Process, micro-structural and soft-magnetic characteristics", Journal of Magnetism and Magnetic Materials, 2020, vol. 494, 165754, 10 pgs., available online Aug. 29, 2019, https://doi.org/10.1016/j.jmmm.2019.165754.
Li et al., "General Investigations on Manufacturing Quality of Permalloy via Selective Laser Melting for 3D Printing of Customized Magnetic Shields", JOM, 2020, vol. 72, No. 8, pp. 2834-2844, https://doi.org/10.1007/s11837-019-03979-7.
Mazeeva et al., "Magnetic properties of Fe—Ni permalloy produced by selective laser", Journal of Alloys and Compounds, 2020, vol. 814, 152315, 6 pgs., available online Sep. 17, 2019, https://doi.org/10.1016/j.jallcom.2019.152315.
Mikler, "Laser Additive Manufacturing of Magnetic Materials", Thesis, Aug. 2017, 73 pgs.
Mikler et al., "Laser Additive Manufacturing of Magnetic Materials", The Journal of The Minerals, Metals & Materials Society, Jan. 27, 2017, vol. 69, No. 3, pp. 532-543, DOI: 10.1007/S11837-017-2257-2.
Mikler et al., "Laser additive processing of Ni—Fe—V and N9—Fe—Mo Permalloys: Microstructure and magnetic prosperities", Materials Letters, 2017, vol. 192, pp. 9-11, available online Jan. 16, 2017, http://dx.doi.org/10.1016/j.jmatlet.2017.01.059.
Perigo et al., "Additive manufacturing of magnetic materials", Additive Manufacturing, 2019, vol. 30, 100870, 18 pgs., available online Sep. 14, 2019, https://doi.org/10..1016/j.addma.2019.100870.
Schonrath et al., "Additive manufacturing of soft magnetic permalloy from Fe and Ni powders: Control of magnetic anisotropy", Journal of Magnetism and Magnetic Materials, 2019, vol. 478, pp. 274-278, available online Jan. 6, 2019, https://doi.org/10.1016/j.jmmm.2018.11.084.
Shishkovsky et al., "Peculiarities of selective laser melting process of for permalloy powder", Materials Letters, 2016, vol. 171, pp. 208-211, available online Feb. 22, 2016, http://dx.doi.org/10.1015/j.matlet.2016.02.099.
Vovrosh et al., "Additive manufacturing of magnetic shielding and ultra-high vacuum flange for cold atom sensors", arXiv:1710.08279 [physics.app-ph], Jan. 9, 2018, 11 pgs.
Vovrosh et al., "Additive manufacturing of magnetic shielding and ultra-high vacuum flange for cold atom sensors", Scientific Reports, Jan. 31, 2018, vol. 8, No. 2023, 10 pgs., DOI:10.1038/s41598-018-20352-x.
Waeckerle et al., "Evolution and recent developments of 80%Ni permalloys", Journal of Magnetism and Magnetic Materials, 2020, vol. 505, 166635, 8 pgs., https://doi.org/10.1616/j.jmmm.2020.066635.
Yi et al., "Computational study on microstructure evolution and magnetic property of laser additively manufactured magnetic materials", arXiv:1802.09821 [cond-mat.mtrl-sci], Feb. 13, 2019, 20 pgs.
Zhang et al., "Magnetic properties of in-situ synthesized FeNi3 by selective Taser melting Fe-80%Ni powders", Journal of Magnetism and Magnetic Materials, 2013, vol. 336, pp. 49-54, available online Feb. 21, 2013, http://dx.doi.org/10.1016/j.jmmm.2013.02.014.
Zou et al., "Controlling the grain orientation during laser powder bed fusion to tailor the magnetic characteristics in a Ni—Fe based soft magnet", Acta Materialia, 2018, vol. 158, pp. 230-238, available online Jul. 30, 2018, https://doi.org/10.1016/j.actamat.2018.07.064.

\* cited by examiner

METHOD FOR FORMING MULTI-MATERIAL ELECTROMAGNETIC SHIELD

CROSS-REFERENCE TO RELATED APPLICATIONS

The current application claims the benefit of and priority under 35 U.S.C. § 119 (e) to U.S. Provisional Patent Application No. 63/061,643 entitled "Additively Manufactured Multi-Material Electromagnetic Shielding" filed Aug. 5, 2020. The disclosure of U.S. Provisional Patent Application No. 63/061,643 is hereby incorporated by reference in its entirety for all purposes.

STATEMENT OF FEDERAL SUPPORT

This invention was made with government support under Grant No. 80NM0018D0004 awarded by NASA (JPL). The government has certain rights in the invention.

FIELD OF THE INVENTION

The present invention generally relates to systems and methods for multi-material electromagnetic shields; and more particularly to systems and methods for additively manufactured multi-material electromagnetic shields.

BACKGROUND

A common method of mitigating unwanted magnetic effects is to shield the component of interest with a magnetic shield. The conventional magnetic shield design may need sheet metal fabricating and metal forming techniques. Shielding shapes can include sheet metal cylinders, complex weldments, and precision machined housings. Magnetic shielding made with high magnetic permeability materials used in critical applications can be challenging to iteratively design and to fabricate. In addition, use of a single material shield may be limited in performance where strong magnetic fields may need to be contained or shielding may be needed for multiple types of electromagnetic (EM), such as high frequency radio frequency (RF), or AC generated EM vs. DC generated EM. Multi-material shields made with different materials which are optimized to specific shielding requirements may be a potential solution. However, fabrication by conventional means can result in further geometric limitations in shield designs, losses from additional interfaces (e.g. welded, brazed or mechanical joints), added complexity, and added mass.

BRIEF SUMMARY OF THE INVENTION

Systems and methods in accordance with various embodiments of the invention enable the design and/or fabrication of multi-material electromagnetic shielding and methods for their additive manufacture. Many embodiments provide electromagnetic shields can be fabricated with different materials using additive manufacturing processes. Geometrically complex shields in accordance with several embodiments can be manufactured with alternating shielding materials optimized for the end use applications. Some embodiments provide that hierarchical structures where the microstructure is locally tuned can further optimize magnetic shielding performance. Several embodiments provide that additive manufacturing process can tune the microstructures of electromagnetic shields by controlling the print parameters including (but not limited to) laser power and scan speed.

One embodiment of the invention includes a method for forming a multi-material electromagnetic shield comprising:
providing at least one powderized feedstock of a magnetic alloy;
determining at least one printing parameter for an additive manufacturing process;
depositing the at least one powderized feedstock in a vertical orientation using the determined at least one printing parameter to additively manufacture an electromagnetic shield with at least one shield wall; and
post-processing the electromagnetic shield by at least one of stress relief anneal, hot isostatic pressing, full anneal, and surface finishing;
where the at least one powderized feedstock is delivered by at least one powder feeder, the additive manufacturing process uses a laser as a power source, the deposition is in a chamber filled with an inert gas, and the thickness of the at least one shield wall is controlled by a spot size of the laser.

In an additional embodiment, the at least one printing parameter is selected from the group consisting of laser power, laser spot size, laser scan speed, hatch spacing, layer thickness, and powder mass flow rate.

In another embodiment, the laser power is tuned to optimize magnetic saturation, coercivity, and magnetic permeability of the electromagnetic shield.

In a further embodiment, the laser power is at least 600 W.

In still another embodiment, the laser power is about 650 W.

In a yet further embodiment, the laser spot size is at least 0.04 inch in diameter.

In a still further embodiment, the laser scan speed is tuned to control hierarchical microstructures of the electromagnetic shield.

In yet another additional embodiment, the laser scan speed is between about 16 ipm and about 76 ipm.

In a further embodiment again, the hatch spacing is at least 0.025 inch.

In another additional embodiment, the layer thickness is at least 0.01 inch.

In a still yet further embodiment, the powder mass flow rate is between about 10 g/min and about 14 g/min.

In still another embodiment, the magnetic alloy is selected from the group consisting of a Ni—Fe based magnetic alloy, a Co—Fe based magnetic alloy, a Cu based alloy, and an Al based alloy.

In yet another further embodiment, the Ni—Fe based magnetic alloy is Fe-80Ni-5Mo or Fe-49Ni.

In a further still embodiment again, the Co—Fe based magnetic alloy is Fe-49Co-2V.

In yet another additional embodiment, the additive manufacturing process is selected from the group consisting of blown powder directed energy deposition (DED), laser engineered net shaping (LENS), and wire feed DED.

In a further embodiment again, the at least one powderized feedstock has a spherical shape and the spherical powder has a diameter between about 45 microns and about 150 microns.

In a yet further embodiment, the chamber is filled with argon.

In another yet further embodiment, the chamber has an oxygen concentration of less than about 10 ppm.

In yet another embodiment again, the chamber has a build volume of about 600 mm by 600 mm by 600 mm.

In still another further embodiment, the stress relief anneal is at about 788° C. for about 1 hour.

In another yet further embodiment, the hot isostatic pressing is at about 2050° F., about 14.75 ksi for about 3 to 4 hours.

In a still further embodiment, the full anneal is at about 2150° F. for about 5 hours.

In yet another embodiment again, four powder feeders simultaneously deliver four different powderized feedstocks.

In another additional embodiment, the at least one shield wall has a thickness of about 1.5 mm.

In yet another further embodiment, the electromagnetic shield has a cylindrical shape, a rectangular shape, or a box shape.

In another yet further embodiment again, the electromagnetic shield has two shield walls, wherein each shield wall comprises alternating layers of a high magnetic permeability alloy with a high magnetic saturation alloy.

In an additional further embodiment, the high magnetic permeability alloy is Fe-80Ni-5Mo, and the high magnetic saturation alloy is Fe-49Ni or Fe-49Co-2V.

In still another embodiment, the electromagnetic shield has two shield walls, wherein an inner shield wall comprises a high magnetic saturation alloy and an outer shield wall comprises a high magnetic permeability alloy.

In yet another embodiment, the high magnetic saturation alloy is Fe-49Ni, and the high magnetic permeability alloy is Fe-80Ni-5Mo.

In a still further embodiment, the electromagnetic shield has two shield walls, wherein the two shield walls comprise a high magnetic permeability alloy, and an inner wall has a different microstructure than an outer wall.

A further still embodiment again includes a multi-material electromagnetic shield comprising a base and two shield walls; where the electromagnetic shield has a cylindrical shape or a rectangular shape, the two shield walls are aligned along the center, and each shield wall comprises alternating layers of a high magnetic permeability alloy with a high magnetic saturation alloy.

Another yet further embodiment includes a multi-material electromagnetic shield comprising a base and two shield walls; where the electromagnetic shield has a cylindrical shape or a rectangular shape, the two shield walls are aligned along the center, and an inner shield wall comprises a high magnetic saturation alloy and an outer shield wall comprises a high magnetic permeability alloy.

Additional embodiments and features are set forth in part in the description that follows, and in part will become apparent to those skilled in the art upon examination of the specification or may be learned by the practice of the disclosure. A further understanding of the nature and advantages of the present disclosure may be realized by reference to the remaining portions of the specification and the drawings, which forms a part of this disclosure.

BRIEF DESCRIPTION OF THE DRAWINGS

The description will be more fully understood with reference to the following figures, which are presented as exemplary embodiments of the invention and should not be construed as a complete recitation of the scope of the invention, wherein.

DETAILED DESCRIPTION OF THE INVENTION

Figure 1:
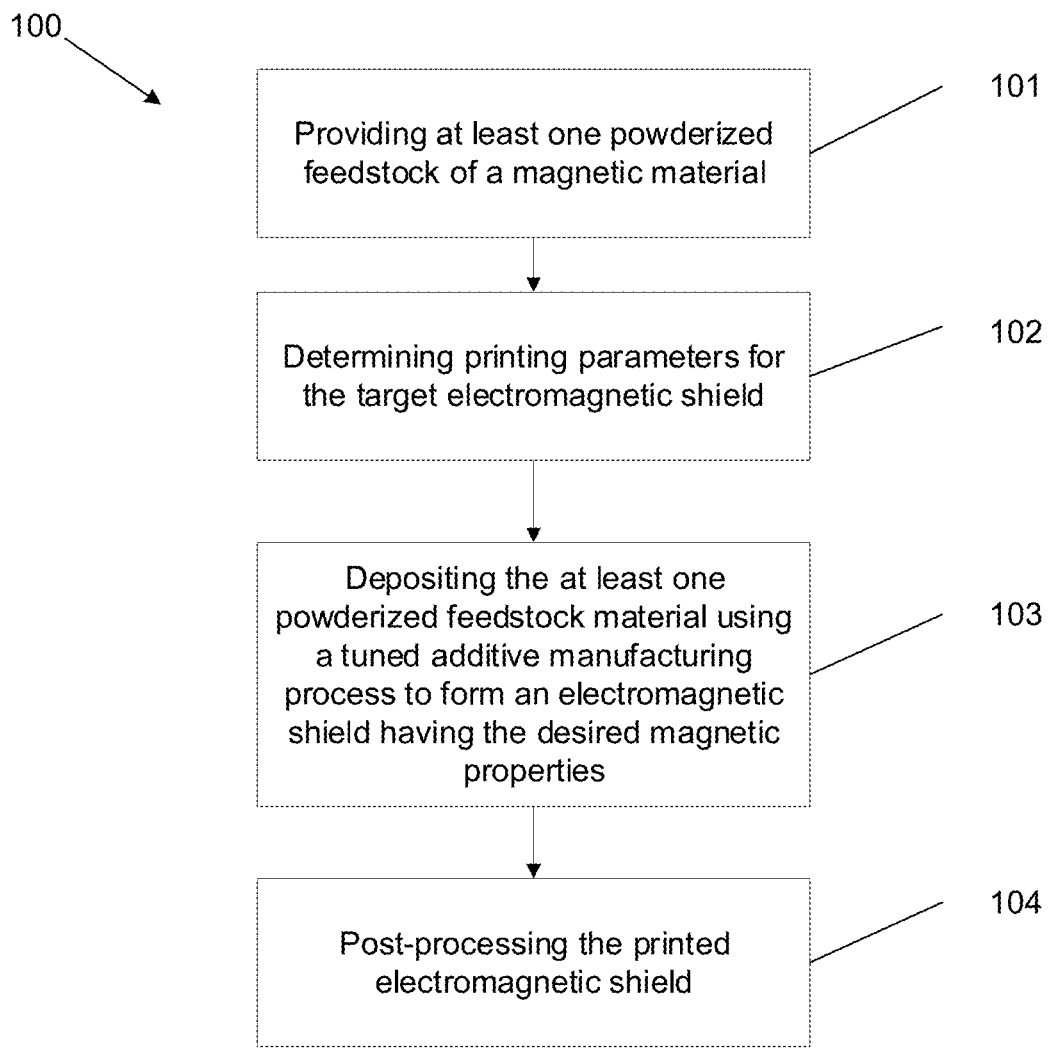
FIG. 1 illustrates a fabrication process for multi-material electromagnetic shields using additive manufacturing in accordance with an embodiment of the invention.

Turning now to the drawings, electromagnetic shielding fabricated with different materials and their methods of additive manufacture in accordance with various embodiments are illustrated. Many embodiments provide the end to end manufacturing processes for electromagnetic shielding. Several embodiments use co-deposition to incorporate multiple materials and/or microstructures selected to achieve shield properties that are spatially specified. Some embodiments provide additive manufacturing methods including (but not limited to) blown powder directed energy deposition (DED), laser engineered net shaping (LENS), and wire feed DED, for fabricating multi-material electromagnetic shields. Geometrically complex shields in accordance with several embodiments can be manufactured with alternating shielding materials optimized for the end use applications. In many embodiments, additive manufacturing process can use (but not limited to) a multi hopper powder feeder based DED system where different alloys can be fed from hoppers to manufacture geometrically complex shields. In certain embodiments, the geometrically complex shields can be selectively graded in strategic geometries to optimize electromagnetic shielding performance. Some embodiments provide that hierarchical structures where the microstructure is locally tuned can further optimize magnetic shielding performance. Several embodiments provide that additive manufacturing process can tune the microstructures of electromagnetic shields by controlling the print parameters including (but not limited to) laser power and scan speed. In many embodiments, post process treatment including (but not limited to) heat treatment and surface finishing, can be applied to optimize shield properties. Several embodiments provide that careful selection of printing process parameters and/or post process parameters can be important for additive manufacturing of these alloys and graded multi-materials.

Many embodiments implement high magnetic permeability and/or high magnetic saturation materials for magnetic shielding. Permeability may determine the effectiveness with which a given shield can entrap magnetic flux by offering it a low reluctance path. Saturation may determine the maximum flux density that a given shield can entrap based on its thickness and the intensity of the magnetic field. Several embodiments implement Ni—Fe based magnetic shielding alloys for electromagnetic shields. Table 1 below lists nominal chemical compositions for different Ni—Fe based magnetic shielding alloys from ASTM A753. Several embodiments co-deposit different materials and/or different microstructures selected to achieve specific shield properties during additive manufacturing process. In some embodiments, magnetic shields can be additively manufactured by deposition of alternating layers of high permeability alloys including (but not limited to) Fe-80Ni-5Mo (UNS N14080) with high saturation alloys including (but not limited to) Fe-49Ni (UNS K94840) or Fe-49Co-2V. In certain embodiments, magnetic shields can be additively manufactured by deposition of alternating layers of high permeability alloys including (but not limited to) Fe-80Ni-5Mo with high frequency RF shielding alloys including (but not limited to) Cu based alloy, and Al based alloy. In a number of embodiments, magnetic shields can be additively manufactured by deposition of high permeability alloys including (but not limited to) Fe-80Ni-5Mo with a hierarchical microstructure. In many embodiments, the different alloys and microstructures may be functionally graded to facilitate transition between each other with minimal residual stress and without deleterious phases. As can readily be appreciated, any of a variety of alloys can be utilized as appropriate to the requirements of specific applications in accordance with various embodiments of the invention.

TABLE 1

Nominal Chemical Composition for Ni—Fe Based Magnetic Shielding Alloy

|  | Alloy 1 UNS K94490 | Alloy 2 UNS K94840 | Alloy 3 UNS N14076 | Alloy 4 UNS N14080 |
| --- | --- | --- | --- | --- |
| Carbon, max. | 0.05 | 0.05 | 0.05 | 0.05 |
| Manganese, max. | 0.80 | 0.80 | 1.5 | 0.80 |
| Silicon, max. | 0.50 | 0.50 | 0.50 | 0.50 |
| Phosphorus, max. | 0.03 | 0.03 | 0.02 | 0.02 |
| Sulfur, max. | 0.01 | 0.01 | 0.01 | 0.01 |
| Chromium | 0.30 max. | 0.30 max. | 2.0-3.0 | 0.30 max. |
| Nickel | 43.5-46.5 | 47.0-49.0 | 75.0-78.0 | 79.0-82.0 |
| Molybdenum | 0.30 max. | 0.30 max. | 0.50 max | 3.5-6.0 |
| Cobalt, max. | 0.50 | 0.50 | 0.50 | 0.50 |
| Copper | 0.30 max. | 0.30 max. | 4.0-6.0 | 0.30 max. |
| Iron* | Balance | Balance | Balance | Balance |

*Iron is the balance by difference. Quantitative analysis of this element may not be required.

In many embodiments, additive manufacturing processes utilize specific printing process parameters and/or post process parameters to optimize geometries and/or magnetic properties of the printed shields. The blown powder DED processes in accordance with several embodiments include the deposition of at least one material powder into a melt pool that is created by an energy source including (but not limited to) laser and electron beam on a substrate. Some embodiments provide that the blown powder DED processes can be used for 3D fabrication of a desired part geometry, functionally graded joining of materials, in-situ fabrication of alloys or metal matrix composites via co-deposition, adding material onto an existing part for repair, coating, and cladding. Several embodiments implement laser and/or electron beam as power sources for additive manufacturing processes. Many embodiments provide that laser power for additive manufacturing processes can be at least 500 W. In some embodiments, laser power is at least 600 W. In several embodiments, laser power is from about 600 W to about 1700 W. Certain embodiments use laser power at about 600 W, about 650 W, about 1070 W, or about 1700 W. Several embodiments control the print parameters including (but not limited to) laser power and scan speed to tune the microstructures of the additively manufactured electromagnetic shields. In many embodiments, laser scan speed can be from about 16 ipm to about 76 ipm. Several embodiments implement laser scan speed from about 24 ipm to about 56 ipm. Some embodiments provide that laser spot size used during additive manufacturing processes can be at least 0.02 inch in diameter. In a number of embodiments, laser spot size is at least 0.04 inch in diameter. Certain embodiments provide that laser spot size is from about 0.04 inch to about 0.085 inch in diameter. Several embodiments use laser spot size with a diameter of about 0.04 inch (1 mm), about 0.07 inch (1.78 mm), or about 0.085 inch (2.16 mm). Many embodiments provide that a minimum wall thickness (or feature size) of magnetic shields may be limited by the spot size of the laser optic. In some embodiments, the printed wall thickness of the shields can be about 1.5 mm. A thinner wall thickness should be possible to print with a smaller laser spot size, or a thicker wall thickness may be possible with a larger laser spot size in accordance with several embodiments. As can readily be appreciated, any of a variety of printing parameters can be utilized as appropriate to the requirements of specific applications in accordance with various embodiments of the invention.

In many embodiments, electromagnetic shields have an enclosure type design. Since magnetic flux may follow the path of least reluctance, the high permeability of the enclosure shape can absorb and/or shunt the magnetic flux, leaving the inside of the enclosure with a lower or attenuated magnetic field. Several embodiments provide that electromagnetic shields can have a cylindrical shape, a rectangular shape, or a box shape. A cylindrical shaped magnetic shield has at least one curved shielding surface. A rectangular shaped magnetic shield has at least one flat shielding surface. As can readily be appreciated, any of a variety of electromagnetic shield geometry can be utilized as appropriate to the requirements of specific applications in accordance with various embodiments of the invention. Geometry of the printed electromagnetic shields may be limited by the printing machine. Some embodiments implement 3-axis rotary delivery systems for additive manufacture. Several embodiments implement 5-axis blown powder DED machines, which may allow more geometric freedom.

Many embodiments provide that the electromagnetic shields have at least one wall. In certain embodiments, the electromagnetic shields can have two walls or three walls. Some embodiments provide that a same wall of the magnetic shields can be made with a same high permeability magnetic material. In a number of embodiments, a same wall of the magnetic shields can be made with a same high permeability material with hierarchical microstructures. In several embodiments, a same wall of the magnetic shields can be made with materials of different magnetic properties including (but not limited to) alternating high permeability magnetic material and high saturation magnetic material, and alternating high permeability magnetic material and high frequency RF shielding material. In some embodiments, an inner wall and an outer wall of the magnetic shields can be made with materials of different magnetic properties. Several embodiments provide that an inner wall of the shields can be made with high saturation materials and an outer wall can be made with high permeability materials, or an inner wall can be made with high permeability materials and an outer wall can be made with high saturation materials. As can readily be appreciated, any of a variety of electromagnetic shield design can be utilized as appropriate to the requirements of specific applications in accordance with various embodiments of the invention. In many embodiments, the additive manufactured electromagnetic shields have magnetic saturation of at least about 6750 Gauss (G). Some embodiments provide the printed magnetic shields have magnetic coercivity of at least about 0.05 oersted (Oe). Certain embodiments provide that the printed magnetic shields have magnetic permeability of at least 6200.

In many embodiments, post process treatment can be applied to optimize shield properties. Examples of post process include (but are not limited to) stress relief annealing, hot isostatic pressing, full annealing, chemical surface finishing, and any combinations thereof. Chemical surface finishing process in accordance with some embodiments can improve the surface finish of the printed shields.

The described apparatuses, systems, and methods should not be construed as limiting in any way. Instead, the present disclosure is directed toward all novel and nonobvious features and aspects of the various disclosed embodiments, alone and in various combinations and sub-combinations with one another. The disclosed methods, systems, and apparatus are not limited to any specific aspect, feature, or combination thereof, nor do the disclosed methods, systems, and apparatus require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, systems, and apparatuses can be used in conjunction with other systems, methods, and apparatus.

Systems and methods for additive manufacturing electromagnetic shielding in accordance with various embodiments of the invention are discussed further below.

Methods of Additive Manufacturing Multi-Material Electromagnetic Shielding

Many embodiments provide methods of manufacturing electromagnetic shield with magnetic properties via an additive manufacturing process. Several embodiments provide that additive manufacturing methods including (but not limited to) blown powder directed energy deposition (DED), laser engineered net shaping (LENS), and wire feed DED, can be used for fabricating multi-material electromagnetic shields. An additive manufacturing process for fabricating an electromagnetic shield in accordance with an embodiment of the invention is illustrated in FIG. 1. The manufacturing process (100) can start with preparing at least one feedstock of a powderized magnetic material (101). Several embodiments implement four powder feeders for simultaneous delivery of four different magnetic material powders during a build. Many embodiments implement powderized magnetic material as feed materials. Several embodiments provide that the magnetic material powder can have a diameter from about 25 microns to about 200 microns. In some embodiments, the magnetic material powder can have a diameter ranging from about 45 microns to about 150 microns. Certain embodiments provide that the powder have spherical shapes. Many embodiments implement materials with high magnetic permeability, high magnetic saturation, and/or high frequency RF shielding properties in powder form as feed materials. Examples of feed material with nominal composition are listed in Table 1.

Printing parameters can be determined for the target electromagnetic shield (102). Energy sources such as laser or electron beam in accordance with embodiments can be used to provide energy for material melting and consolidation. The blown powder DED process involves the deposition of a material powder into a melt pool that is created by an energy source on a substrate. Several embodiments tune the microstructures of electromagnetic shields by controlling the print parameters including (but not limited to) laser power and scan speed. The microstructures of electromagnetic shields may affect the target magnetic properties. Many embodiments provide that the microstructure of the shields can be tuned to create a magnetic response specific to a given magnetic field. In some embodiments, laser power is at least 600 W. Several embodiments provide that laser power can be from about 600 W to about 1700 W. Certain embodiments use laser power at about 600 W, about 650 W, about 1070 W, or about 1700 W. Many embodiments provide that laser scan speed can be from about 16 ipm to about 76 ipm. Some embodiments use laser scan speed from about 24 ipm to about 56 ipm. In a number of embodiments, laser spot size is at least 0.04 inch in diameter. In certain embodiments, laser spot size is from about 0.04 inch in diameter to about 0.085 inch in diameter. Several embodiments use laser spot size with a diameter of about 0.04 inch (1 mm), about 0.07 inch (1.78 mm), or about 0.085 inch (2.16 mm). In some embodiments, the hatch spacing is at least 0.025 inch. Several embodiments provide the hatch spacing is from about 0.025 inch to about 0.055 inch. Certain embodiments use hatch spacing of about 0.025 inch (0.635 mm), about 0.045 inch (1.14 mm), or about 0.055 inch (1.4 mm). Several embodiments provide that powder mass flow ranges from about 10 g/min to about 14 g/min. In many embodiments, layer thickness is at least 0.01 inch (0.25 mm).

The at least one powderized feedstock material can be deposited using a tuned additive manufacturing process to form an electromagnetic shield with desired magnetic properties (103). The deposition can take place in a chamber including (but not limited to) a glove box filled with an inert gas including (but not limited to) argon in accordance with some embodiments. In certain embodiments, the chamber has an oxygen concentration of less than 10 ppm. Some embodiments provide that nitrogen gas filled chamber may interfere with the grain structure due to possible nitride formation. In several embodiments, the chamber can provide a build volume of about 600 m×600 m×600 mm. The electromagnetic shields can be deposited on a substrate. Several embodiments implement flat steel substrates for additive manufacturing processes. Some embodiments provide that the substrates can be curved or have some geometry. In certain embodiments, the substrates can be previously machined components onto which printed magnetic shields can be added. Many embodiments provide that the substrates and magnetic shields can be dissimilar alloys. In several embodiments, the printing of the magnetic shields can be carried out in a vertical direction. Some embodiments implement radial deposition by rotating a mandrel and depositing radially outwards. Certain embodiments provide that the magnetic performance of the shields is poorer in radial orientation deposition than in vertical orientation.

Post-processing treatments can be done to the printed electromagnetic shields (104) to optimize magnetic properties. Examples of post-processing treatment include (but are not limited to) stress relief annealing, hot isostatic pressing, full annealing, chemical surface finishing, and any combinations thereof. In some embodiments, stress relief annealing can be carried out at around 788° C. for about 1 hour. In several embodiments, hot isostatic pressing can be carried out at about 2050° F. and about 14.75 ksi for about 3 to 4 hours. In certain embodiments, full annealing can be done at about 2150° F. for about 5 hours. Chemical surface finishing process in accordance with some embodiments can improve the surface finish of the printed shields.

While various processes of additively manufacturing multi-material electromagnetic shields are described above with references to FIG. 1, any variety of additive manufacturing processes can be utilized as appropriate to the requirements of specific applications in accordance with various embodiments of the invention. Properties of additive manufactured magnetic shields in accordance with various embodiments of the invention are discussed further below.

Properties of Multi-Material Electromagnetic Shielding

Figure 2B:
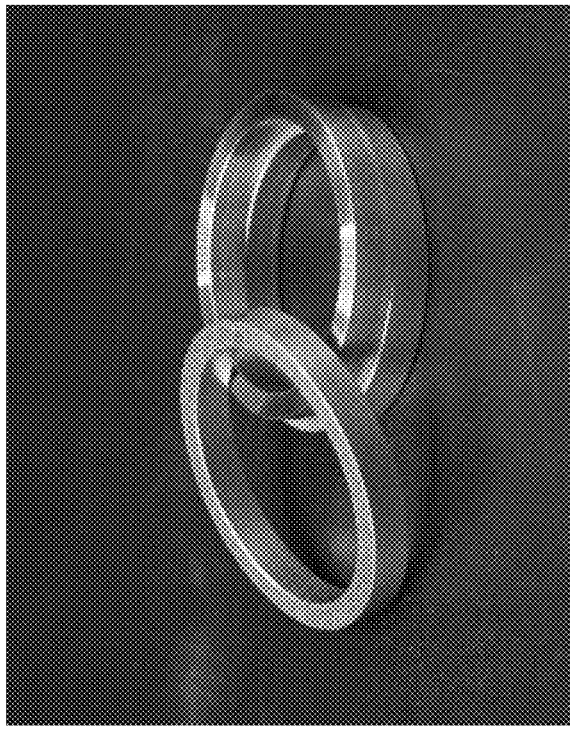
FIGS. 2A and 2B illustrate magnetic hysteresis test rings in the as-printed and fully machined condition in accordance with an embodiment of the invention.
Figure 2A:
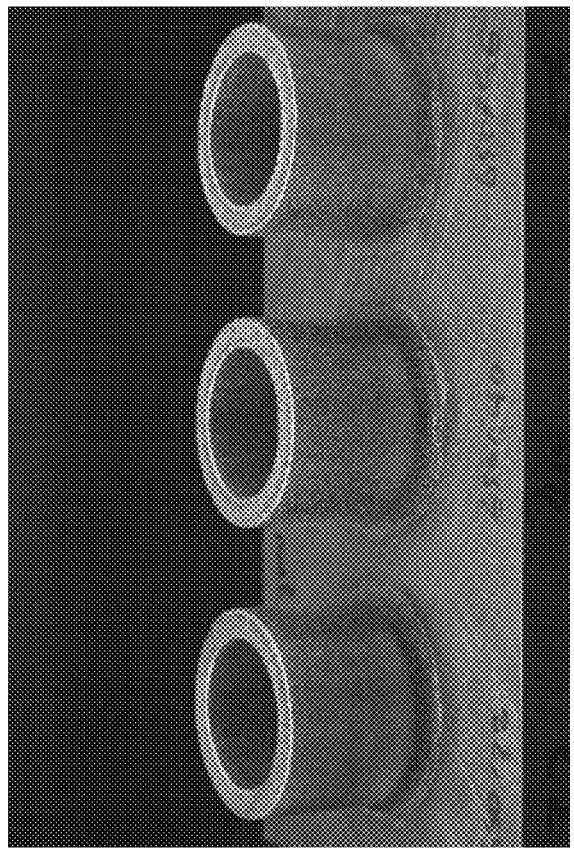

Many embodiments provide optimized magnetic properties of printed multi-material electromagnetic shields. Several embodiments provide that controlling the print parameters including (but not limited to) laser power and scan speed can tune the microstructures of the additively manufactured electromagnetic shields, and hence tune the magnetic properties of the shields. Table 2 lists various parameters used during additive manufacturing processes of making multi-material magnetic shields. Printing process parameters include laser power, laser spot size, hatch spacing, layer thickness, and powder mass flow. Heat treatment (HT) can be carried out after printing to further optimize the magnetic properties. Heat treatment can include stress relief annealing (SRA), hot isostatic pressing (HIP), and full annealing (anneal). Table 2 also includes measured magnetic properties including maximum saturation, coercivity, and maximum permeability, of the printed magnetic shields.

accordance with an embodiment of the invention is illustrated in FIG. 2A and FIG. 2B respectively. The printed magnetic hysteresis test rings in FIG. 2A are fabricated using a RPMI 222 DED system including an argon filled glove box (less than 10 ppm 02) with a 600 m×600 m×600 mm build volume, 4 powder feeders for simultaneous delivery of 4 different powders during a build, and 3-axis plus 1 rotary operation. A 2 kw IPG Ytterbium fiber laser (1073 nm) provides energy for material melting and consolidation.

Figure 3:
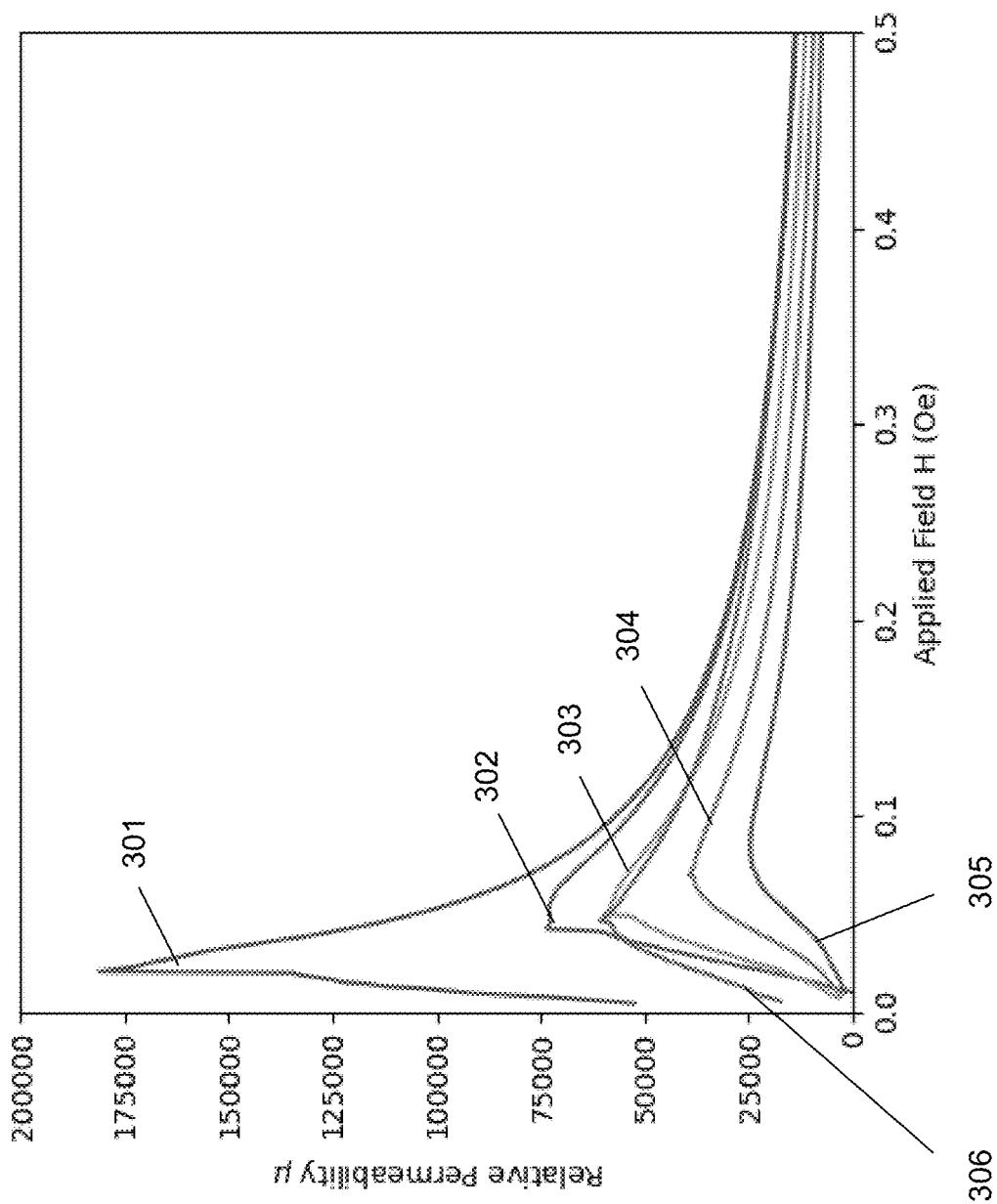
FIG. 3 illustrates relative permeability of wrought and printed alloys in accordance with an embodiment of the invention.

Relative permeability comparison for printed and wrought alloys with identical post process heat treatment in accordance with an embodiment of the invention is illustrated in FIG. 3. Permeability can be defined as a ratio of the flux induced in a material proportional to the ambient or applied magnetic field (expressed as H, measured in Oersted). The high ratio (permeability) indicates the material's ability to induct magnetic flux. Relative permeability of printed and wrought alloys is plotted against applied magnetic field in FIG. 3. The alloy used in FIG. 3 is MuMetal™, which has chemical compositions of ASTM A753 Alloy 4 listed in Table 1. The alloy is printed with different printing parameters. The permeability of the printed and wrought alloys are compared. 301 represents annealed wrought alloy. 306 represents traditionally manufactured and annealed wrought alloy. 302 represents alloy printed with about 650 W laser power and in vertical orientation. 303 represents alloy printed with about 1070 W laser power and in vertical orientation. 304 represents alloy printed with about 1700 W laser power and in vertical orientation. 305 represents alloy printed with about 1700 W laser power and in radial orientation. The alloys (302-305) are printed after heat treating. The printed alloy exhibits relative permeability as high as 75000 (302). Alloy printed in vertical orientation (304) shows higher permeability than alloy printed in radial orientation (305).

While various properties of printed electromagnetic shields are described above with references to FIG. 2A, FIG. 2B, and FIG. 3, any variety of printed electromagnetic shields properties can be utilized as appropriate to the requirements of specific applications in accordance with various embodiments of the invention.

TABLE 2

Printing Process Parameters and Measured Magnetic Properties

| Laser Power (W) | Laser spot size (in) | Hatch spacing (in) | Layer thickness (in) | Powder mass flow (g/min) | Heat Treatment | Max. Saturation (G) | Coercivity (Oe) | Max. Permeability |
|---|---|---|---|---|---|---|---|---|
| 600 | 0.04 | 0.025 | 0.01 | 10-14 | No HT | 7024 | 0.306 | 6203 |
| 600 | 0.04 | 0.025 | 0.01 | 10-14 | SRA + Anneal | 7387 | 0.057 | 49619 |
| 600 | 0.04 | 0.025 | 0.01 | 10-14 | Anneal | 7272 | 0.060 | 44066 |
| 600 | 0.04 | 0.025 | 0.01 | 10-14 | HIP | 7499 | 0.076 | 38338 |
| 600 | 0.04 | 0.025 | 0.01 | 10-14 | HIP + Anneal | 7380 | 0.060 | 46363 |
| 650 | 0.04 | 0.025 | 0.01 | 10-14 | Anneal | 7946 | 0.047 | 68722 |
| 1070 | 0.07 | 0.045 | 0.012 | 10-14 | Anneal | 7087 | 0.052 | 54880 |
| 1700 | 0.085 | 0.055 | 0.02 | 10-14 | Anneal | 6752 | 0.064 | 36058 |

Many embodiments provide additive manufactured ASTM A753 rings and the test results for their magnetic hysteresis both in the as-built and heat-treated conditions. Additive manufactured ASTM A753 magnetic hysteresis test rings in the as-printed and fully machined condition in

EXEMPLARY EMBODIMENTS

The following discussion sets forth embodiments where the additive manufacturing processes for multi-material electromagnetic shielding in accordance with embodiments may find particular application. It will be understood that these embodiments are provided only for exemplary purposed and are not meant to be limiting.

Example 1: Single Material Printed Thin Wall Shield

Figure 4:
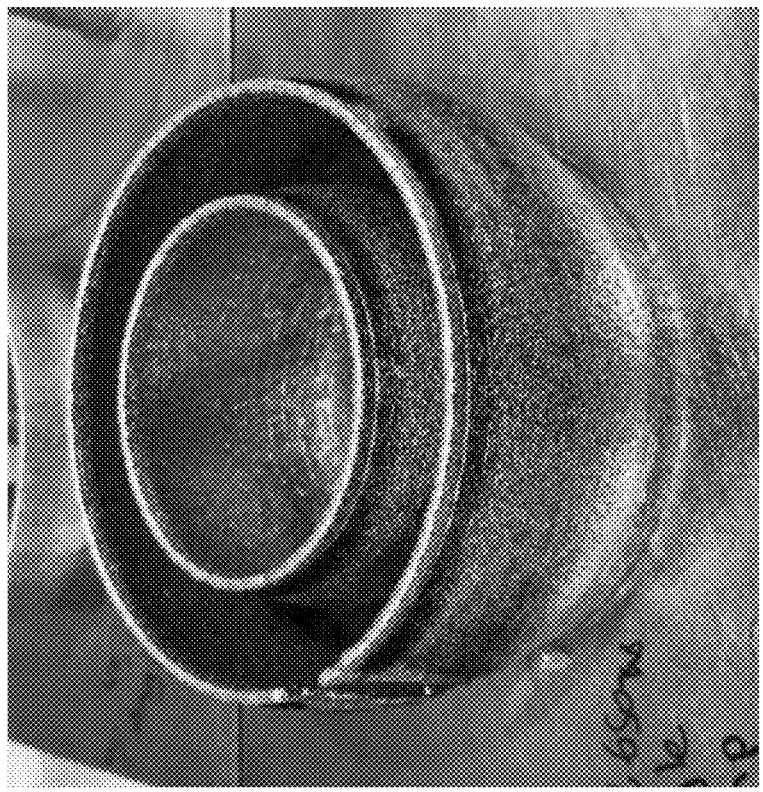
FIG. 4 illustrates a printed single material 2-layer shield in accordance with an embodiment of the invention.

Many embodiments provide magnetic shields fabricated via blown powder DED processes. In some embodiments, the shields can be printed with Fe-80Ni-5Mo alloy. In several embodiments, printing parameters include about 650 watts laser power, about 0.04" diameter laser spot, about 0.025" hatch spacing, and about 0.01" layer thickness. Certain embodiments provide that the printed specimens can be greater than 99% dense. A number of embodiments provide shields fabricated with curved shield walls for enhanced shielding performance. A printed cylindrical magnetic shield in Fe-80Ni-5Mo in accordance with an embodiment of the invention is illustrated in FIG. 4.

Figure 5C:
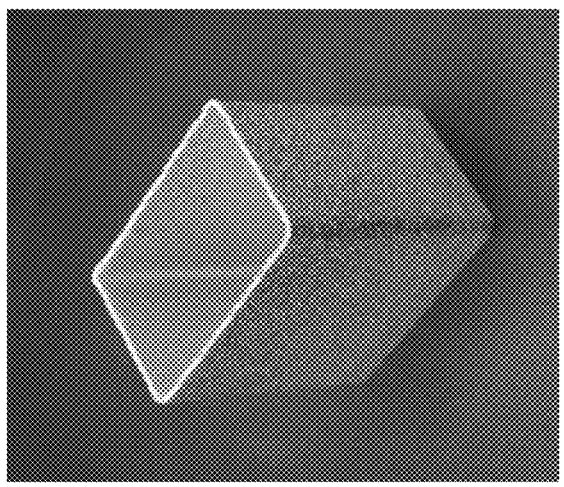
FIGS. 5A-C illustrate a printed 2-layer cylindrical shield, a printed 3-layer cylindrical, and a printed box shield in accordance with an embodiment of the invention.
Figure 5B:
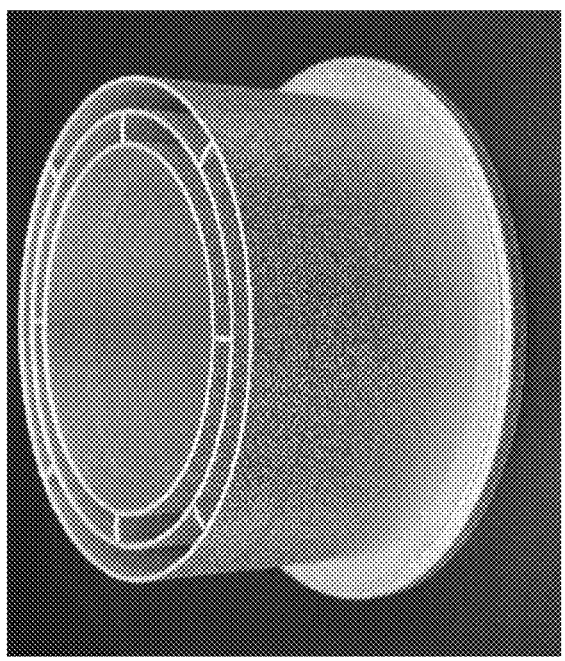
Figure 5A:
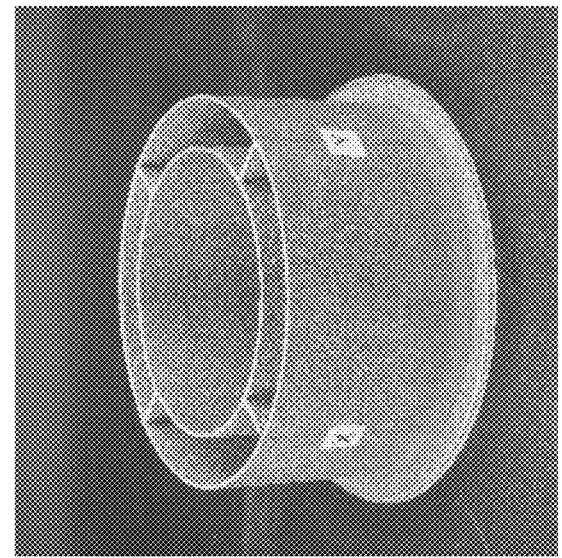

In several embodiments, magnetic field attenuation can be tested for cylindrical shields including (but not limited to) double wall configuration and triple wall configurations, and box shields. Some embodiments provide magnetic field attenuation tests on box shields manufactured using traditional wrought material. All shields in the magnetic field attenuation tests are heat treated prior to testing. A double layer cylindrical shield, a triple layer cylindrical shield, and a box shield, in accordance with an embodiment of the invention is illustrated in FIG. 5A, FIG. 5B, and FIG. 5C respectively. The shields are printed with Fe-80Ni-5Mo alloy. Table 3 lists magnetic shield attenuation test data of additive manufactured shields with comparison to wrought shields of similar dimensions. Additive manufactured shield performance is comparable to traditional wrought shield performance. From test #1 and test #2 in Table 3, the triple wall shield has slightly better shielding effectiveness compare to the double wall shield. The extra shield layer added within the same volume of the original double wall design may show more benefit if higher magnetic strength can be involved where saturation is more of a problem. From test #5 and test #6 in Table 3, shield effectiveness of traditional wrought shield, whether annealed by different labs, yield similar results. Traditional wrought shields (test #5 and test #6) and 3D printed shields (test #3 and test #4) have similar shielding effectiveness results, which shows the shielding effectiveness of the additively manufactured and annealed material is on-par with traditional materials.

TABLE 3

Magnetic Shield Attenuation Test of Additive Manufactured Shields and Wrought Shields

| Test # | Test Article | Measurement (mA · m$^2$) | Shielding Effectiveness (dB) |
| --- | --- | --- | --- |
| 1 | 3D-printed 2 wall cylindrical shield by lab 1 and magnet for RWA-shield | 415 | −27 |
| 2 | 3D-printed 3 wall cylindrical shield by lab 2 and magnet for RWA-shield | 257 | −31 |
| 3 | 3D-printed box shield RWA by lab 1 and magnet for box shield | 248 | −17 |
| 4 | 3D-printed box shield RWA by lab 2 and magnet for box shield | 208 | −18 |
| 5 | Traditional (wrought) box shield (annealed at lab 2) and magnet for box shield | 205 | −18 |
| 6 | Traditional (wrought) box shield (annealed at lab 1) and magnet for box shield | 229 | −17 |

Example 2: Multi-Material Printed Thin Wall Shield

Many embodiments provide magnetic shields fabricated with multi-material by additive manufacturing processes. Several embodiments provide magnetic shields with at least two walls. In some embodiments, base of the shields can be fabricated with nonmagnetic structural steel to facilitate functions including (but not limited to) joining to spacecraft components. In certain embodiments, the shield base may be fabricated from controlled thermal expansion alloys including (but not limited to) aluminum alloy and titanium alloy, to facilitate mounting to ancillary structure.

Figure 6:
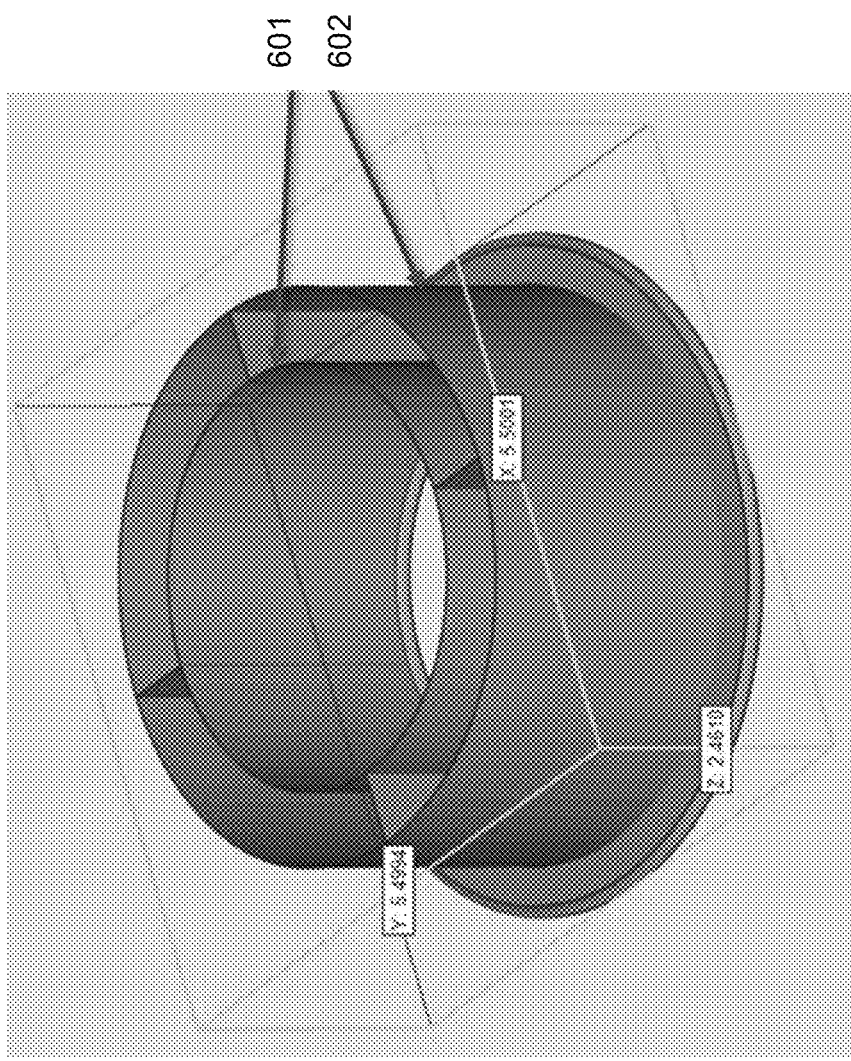
FIG. 6 illustrates a 2-layer cylindrical shield with alternating materials in each wall in accordance with an embodiment of the invention.

In many embodiments, the shield composition can be periodically varied between high saturation materials and high permeability materials within a same wall of the shield. Certain embodiments provide the deposition of alternating layers of a high permeability alloy (i.e. Fe-80Ni-5Mo) with high saturation alloy (i.e. Fe-49Ni or Fe-49Co-2V). A multi-material cylindrical shield with shielding alloy composition varied along each wall periodically with high saturation alloys and high permeability alloys in accordance with an embodiment of the invention is illustrated in FIG. 6. In the inner wall (601) and the outer wall (602) of the double wall shield shown in FIG. 6, shielding alloy composition is varied between high saturation alloys and high permeability alloys periodically.

Figure 7:
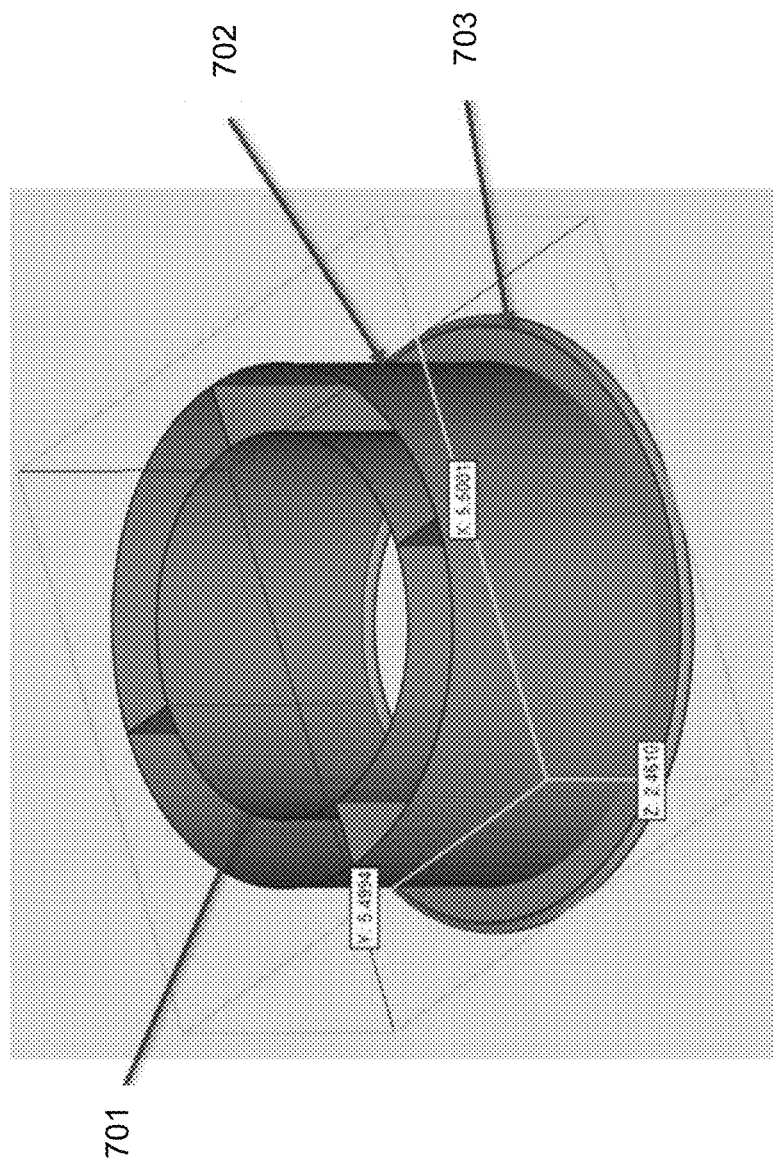
FIG. 7 illustrates a 2-layer cylindrical shield with different materials between each wall in accordance with an embodiment of the invention.

A multi-material cylindrical shield with shielding alloy composition varied between each wall periodically with high saturation alloys and high permeability alloys in accordance with an embodiment of the invention is illustrated in FIG. 7. In FIG. 7, the inner wall (701) of the double wall shield can be fabricated with high saturation magnetic alloys such as Fe-49Ni. The outer wall (702) of the double wall shield can be fabricated with high permeability magnetic alloys such as Fe-80Ni-5Mo. The mounting flange (703) of the double wall shield can be fabricated with alloys to facilitate joining.

Figure 8:
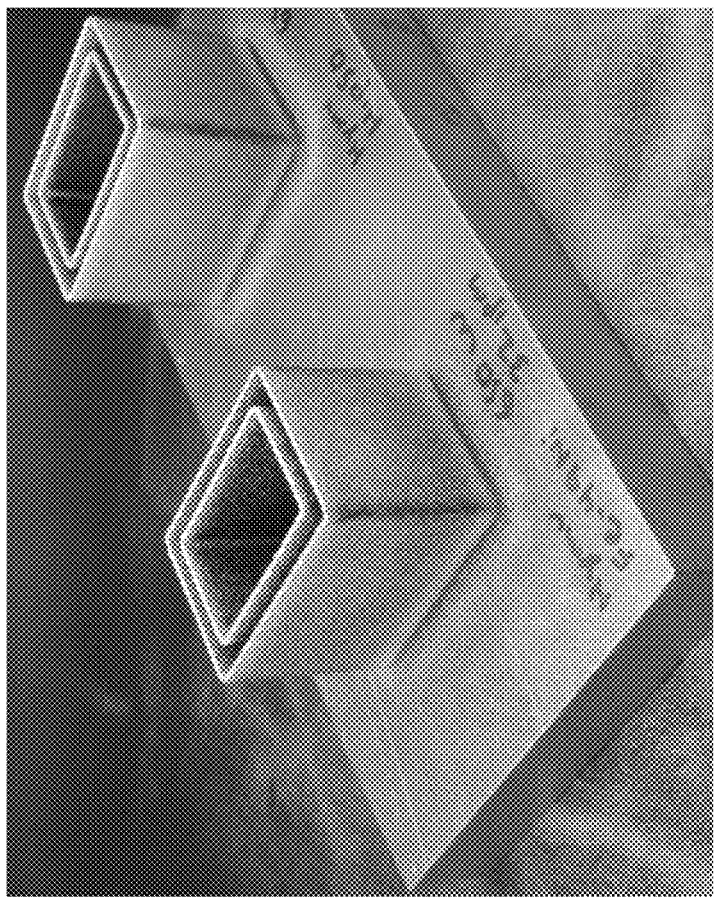
FIG. 8 illustrates a 2-layer rectangular shield printed with different materials between each wall in accordance with an embodiment of the invention.

A printed multi-material rectangular shield with shielding alloy composition varied between each wall periodically with high saturation alloys and high permeability alloys in accordance with an embodiment of the invention is illustrated in FIG. 8. The printed double wall rectangular shield has an inner wall and an outer wall. The inner shield wall can be made of either Fe-49Co-2V or Fe-49Ni. The outer shield wall can be made of Fe-80Ni-5Mo.

Example 3: Printed Thin Wall Shield with Hierarchical Microstructures

Many embodiments provide that microstructural control in electromagnetic shielding alloy depositions can be achieved by varying the laser power and laser scan speed. Several embodiments provide that electromagnetic shielding alloy depositions include a single alloy or a single material used during deposition processes. Deposition of a high permeability alloy (i.e. Fe-80Ni-5Mo) can use different print parameters to tune the local microstructures in accordance with some embodiments. In certain embodiments, the base of the shields may be fine grained to improve mechanical properties. Several embodiments provide that the microstructures of the shield can be tuned to create a magnetic response specific to a given magnetic field.

Figure 9:
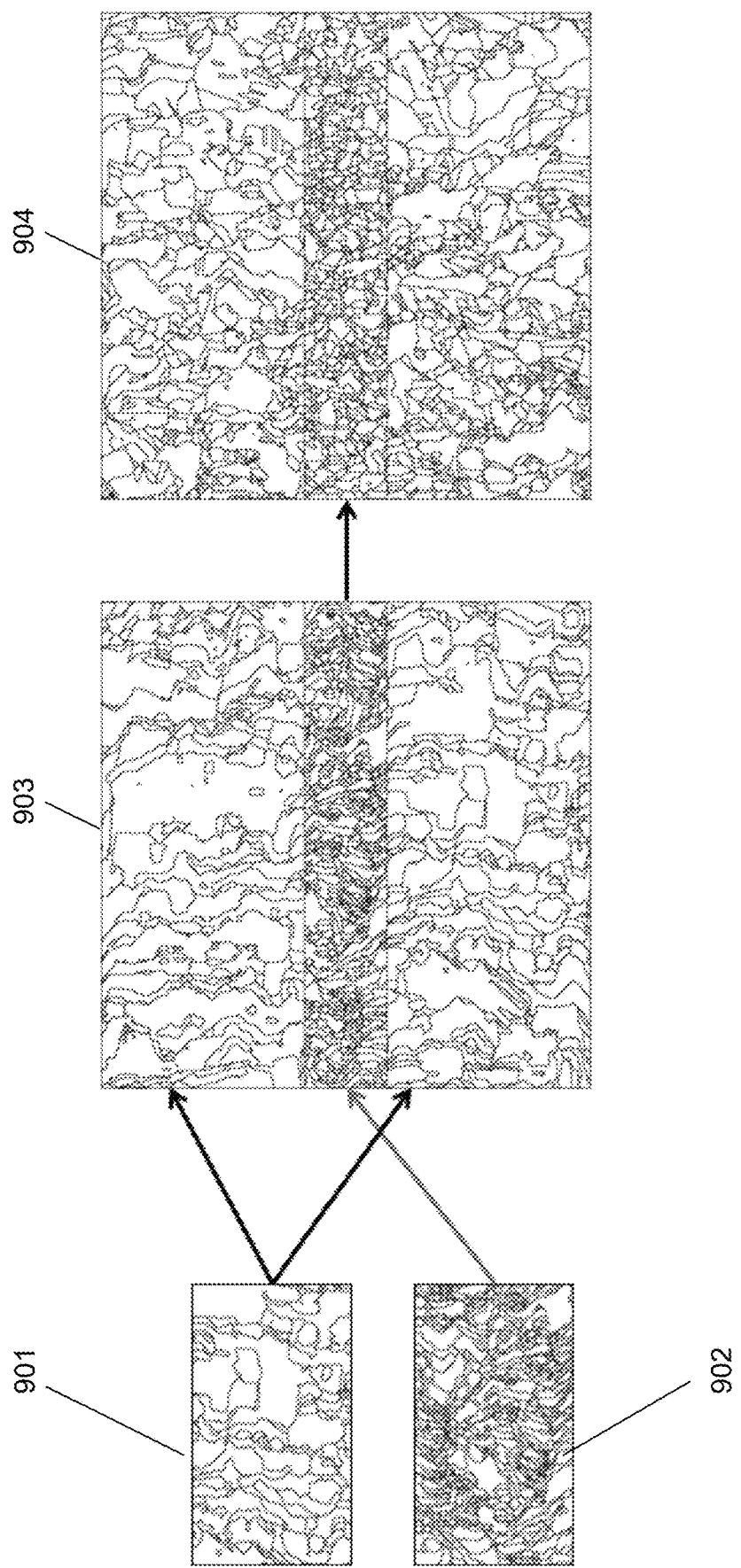
FIG. 9 illustrates hierarchical microstructures formed by changing the printing parameters in accordance with an embodiment of the invention.

Hierarchical microstructures formed by changing the printing parameters during the build process in accordance with an embodiment of the invention is illustrated in FIG. 9. FIG. 9 shows the change of scan speed can affect the hierarchical microstructures of the printed shields. 901 illustrates as-printed microstructure using a low scan speed. 902 illustrates as-printed microstructure using a high scan speed. 903 illustrates as-printed microstructure combining the low scan speed and the high scan speed. 904 illustrates the annealed microstructure combining the low scan speed and the high scan speed.

Figure 10:
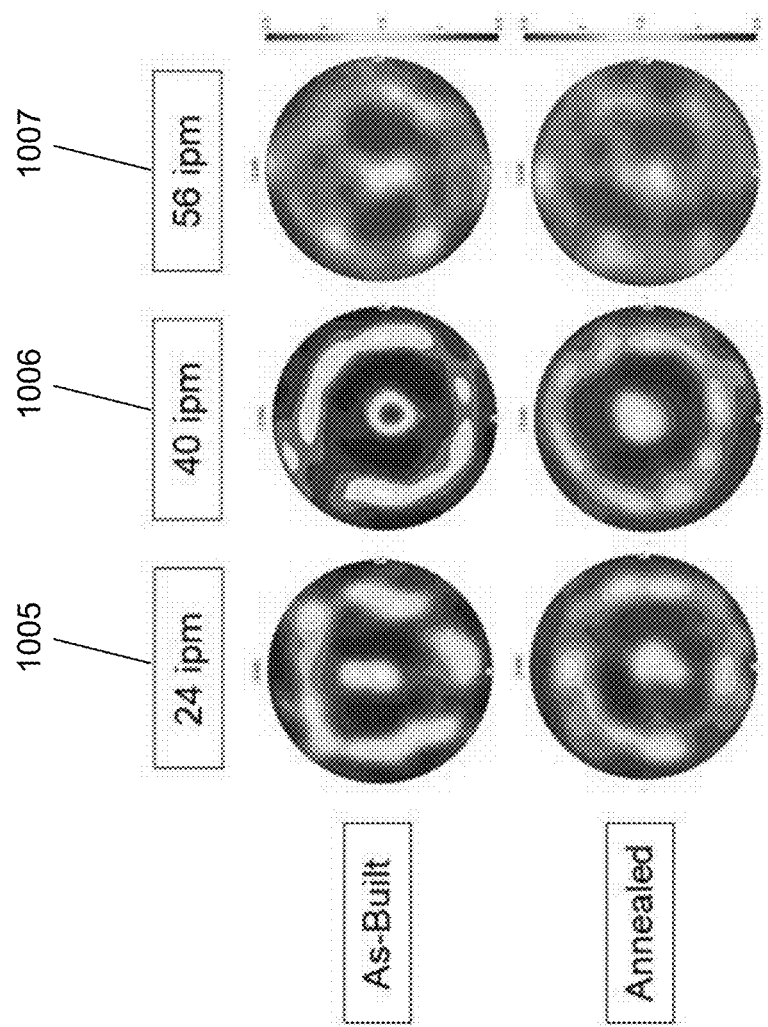
FIG. 10 illustrates different grain sizes and orientations formed by changing the printing parameters in accordance with an embodiment of the invention.

Hierarchical microstructure (grain size and orientation) formed with variation of printing parameters during the build process in accordance with an embodiment of the invention is illustrated in FIG. 10. 1001 shows grain sizes of as-built shields printed with about 650 W laser power and about 24 ipm scan speed. 1002 shows grain sizes of annealed shields that are printed with about 650 W laser power and about 24 ipm scan speed. 1003 shows grain sizes of as-built shields printed with about 650 W laser power and about 56 ipm scan speed. 1004 shows grain sizes of annealed shields that are printed with about 650 W laser power and about 56 ipm scan speed. 1005 shows orientation of as-built shields (top) and annealed shields (bottom) at about 24 ipm scan speed. 1006 shows orientation of as-built shields (top) and annealed shields (bottom) at about 40 ipm scan speed. 1007 shows orientation of as-built shields (top) and annealed shields (bottom) at about 56 ipm scan speed.

Figure 11:
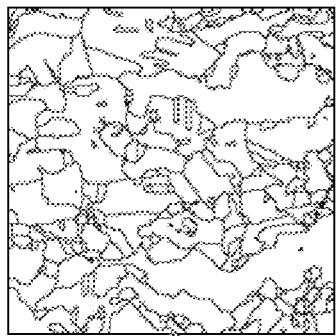
FIG. 11 illustrates a 2-layer cylindrical shield with different microstructures in each wall and in the base in accordance with an embodiment of the invention.
Figure 11:
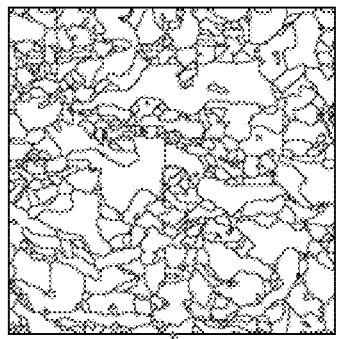
Figure 11:
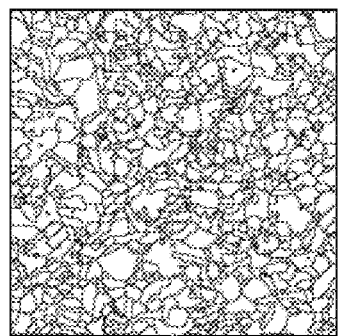
Figure 11:
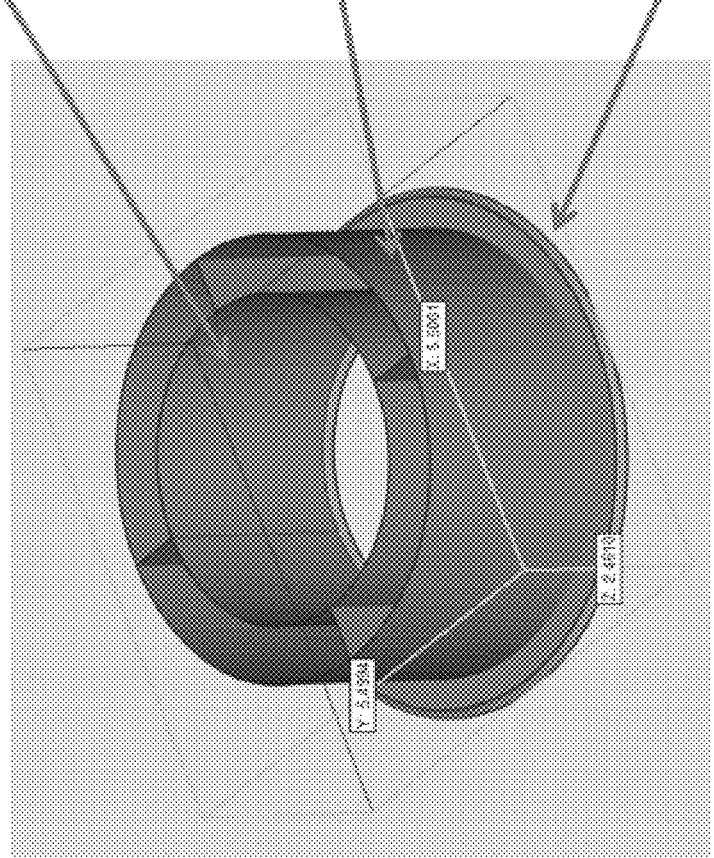

A magnetic shield printed with hierarchical microstructures in the wall and the base in accordance with an embodiment of the invention is illustrated in FIG. 11. FIG. 11 shows a double wall magnetic shield. The inner shield (1101) and the outer shield wall (1102) can have different microstructures in each wall. The microstructures of the inner shield wall (1102) and the outer shield wall (1102) can be tuned to have different magnetic properties in regards to magnetic performance. The base (1103) of the shield can have more fine microstructures. The fine microstructures of the base (1103) can be tuned to improve mechanical properties for structural purposes.

Doctrine of Equivalents

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A method for forming a multi-material electromagnetic shield comprising:
   providing at least one powderized feedstock of a magnetic alloy;
   determining at least one printing parameter for an additive manufacturing process;
   depositing the at least one powderized feedstock in a vertical orientation using the determined at least one printing parameter to additively manufacture an electromagnetic shield with at least one shield wall; and
   post-processing the electromagnetic shield by at least one of stress relief anneal, hot isostatic pressing, full anneal, and surface finishing;
   wherein the at least one powderized feedstock is delivered by at least one powder feeder;
   wherein the additive manufacturing process uses a laser as a power source;
   wherein the deposition is in a chamber filled with an inert gas; and
   wherein the thickness of the at least one shield wall is controlled by a spot size of the laser.

2. The method of claim 1, wherein the at least one printing parameter is selected from the group consisting of laser power, laser spot size, laser scan speed, hatch spacing, layer thickness, and powder mass flow rate.

3. The method of claim 2, wherein the laser power is tuned to optimize magnetic saturation, coercivity, and magnetic permeability of the electromagnetic shield.

4. The method of claim 2, wherein the laser power is at least 600 W.

5. The method of claim 2, wherein the laser power is about 650 W.

6. The method of claim 2, wherein the laser spot size is at least 0.04 inch in diameter.

7. The method of claim 2, wherein the laser scan speed is tuned to control hierarchical microstructures of the electromagnetic shield.

8. The method of claim 2, wherein the laser scan speed is between about 16 ipm and about 76 ipm.

9. The method of claim 2, wherein the hatch spacing is at least 0.025 inch.

10. The method of claim 2, wherein the layer thickness is at least 0.01 inch.

11. The method of claim 2, wherein the powder mass flow rate is between about 10 g/min and about 14 g/min.

12. The method of claim 1, wherein the magnetic alloy is selected from the group consisting of a Ni—Fe based magnetic alloy, a Co—Fe based magnetic alloy, a Cu based alloy, and an Al based alloy.

13. The method of claim 12, wherein the Ni—Fe based magnetic alloy is Fe-80Ni-5Mo or Fe-49Ni.

14. The method of claim 12, wherein the Co—Fe based magnetic alloy is Fe-49Co-2V.

15. The method of claim 1, wherein the additive manufacturing process is selected from the group consisting of blown powder directed energy deposition (DED), laser engineered net shaping (LENS), and wire feed DED.

16. The method of claim 1, wherein the at least one powderized feedstock has a spherical shape and the spherical powder has a diameter between about 45 microns and about 150 microns.

17. The method of claim 1, wherein the chamber is filled with argon.

18. The method of claim 1, wherein the chamber has an oxygen concentration of less than about 10 ppm.

19. The method of claim 1, wherein the chamber has a build volume of about 600 mm by 600 mm by 600 mm.

20. The method of claim 1, wherein the stress relief anneal is at about 788° C. for about 1 hour.

21. The method of claim 1, wherein the hot isostatic pressing is at about 2050° F., about 14.75 ksi for about 3 to 4 hours.

22. The method of claim 1, wherein the full anneal is at about 2150° F. for about 5 hours.

23. The method of claim 1, wherein four powder feeders simultaneously deliver four different powderized feedstocks.

24. The method of claim 1, wherein the at least one shield wall has a thickness of about 1.5 mm.

25. The method of claim 1, wherein the electromagnetic shield has a cylindrical shape, a rectangular shape, or a box shape.

26. The method of claim 1, wherein the electromagnetic shield has two shield walls, wherein each shield wall comprises alternating layers of a high magnetic permeability alloy with a high magnetic saturation alloy.

27. The method of claim 26, wherein the high magnetic permeability alloy is Fe-80Ni-5Mo, and the high magnetic saturation alloy is Fe-49Ni or Fe-49Co-2V.

28. The method of claim 1, wherein the electromagnetic shield has two shield walls, wherein an inner shield wall comprises a high magnetic saturation alloy and an outer shield wall comprises a high magnetic permeability alloy.

29. The method of claim 28, wherein the high magnetic saturation alloy is Fe-49Ni, and the high magnetic permeability alloy is Fe-80Ni-5Mo.

30. The method of claim 1, wherein the electromagnetic shield has two shield walls, wherein the two shield walls comprise a high magnetic permeability alloy, and an inner wall has a different microstructure than an outer wall.

\* \* \* \* \*